(12) United States Patent
Timopheev et al.

(10) Patent No.: US 11,747,411 B2
(45) Date of Patent: Sep. 5, 2023

(54) MAGNETORESISTIVE-BASED SENSING CIRCUIT FOR TWO-DIMENSIONAL SENSING OF HIGH MAGNETIC FIELDS

(71) Applicant: Crocus Technology SA, Grenoble (FR)

(72) Inventors: Andrey Timopheev, Vif (FR); Romain Foissac, Grenoble (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 248 days.

(21) Appl. No.: 17/312,558

(22) PCT Filed: Nov. 29, 2019

(86) PCT No.: PCT/IB2019/060324
§ 371 (c)(1),
(2) Date: Jun. 10, 2021

(87) PCT Pub. No.: WO2020/121108
PCT Pub. Date: Jun. 18, 2020

(65) Prior Publication Data
US 2022/0043081 A1 Feb. 10, 2022

(30) Foreign Application Priority Data
Dec. 13, 2018 (EP) .................................. 18315050

(51) Int. Cl.
*G01R 33/09* (2006.01)
(52) U.S. Cl.
CPC .................. *G01R 33/098* (2013.01)
(58) Field of Classification Search
CPC .............. G01R 33/098; G01R 33/0023; G01R 33/0094; G01B 7/30
See application file for complete search history.

(56) References Cited

U.S. PATENT DOCUMENTS

2004/0216534 A1* 11/2004 Ruhrig .................... G01L 1/125
73/779
2009/0189601 A1* 7/2009 Okada .................... G01D 5/145
324/207.21

(Continued)

FOREIGN PATENT DOCUMENTS

JP 2014157985 A 8/2014

OTHER PUBLICATIONS

International Search Report for PCT/IB2019/060324 dated Mar. 6, 2020.
Written Opinion for PCT/IB2019/060324 dated Mar. 6, 2020.

*Primary Examiner* — Alvaro E Fortich
(74) *Attorney, Agent, or Firm* — Pearne & Gordon LLP

(57) ABSTRACT

A magnetic sensing circuit includes a circuit portion including: a main half-bridge including series-connected main tunnel magnetoresistive sensor elements TMR1 and TMR2; a first auxiliary half-bridge connected in parallel to the main half-bridge and including series-connected auxiliary tunnel magnetoresistive sensor elements TMR3 and TMR4 with an output voltage emerging from the connection between TMR1 and TMR3 and between TMR2 and TMR4; wherein a reference magnetization of the magnetoresistive sensor element TMR1 and TMR3 are respectively oriented substantially antiparallel with respect to a reference magnetization of the magnetoresistive sensor element TMR2 and TMR4; and wherein said first auxiliary half-bridge has a sensing axis that differs from the sensing axis of the main half bridge by an angle of about 180°/n, where n is the harmonic number to be canceled. The magnetic sensing circuit allows for sensing of external magnetic fields having high magnitude, with reduced angular error.

9 Claims, 11 Drawing Sheets

(56) References Cited

U.S. PATENT DOCUMENTS

| | | |
|---|---|---|
| 2011/0037459 A1 | 2/2011 | Okada et al. |
| 2015/0108971 A1* | 4/2015 | Granig ................. G01R 33/091 |
| | | 324/252 |
| 2015/0137797 A1* | 5/2015 | Ausserlechner ......... G01D 3/08 |
| | | 324/207.13 |
| 2016/0258781 A1* | 9/2016 | Ausserlechner ......... G01D 5/16 |
| 2018/0113179 A1 | 4/2018 | Deak et al. |

* cited by examiner

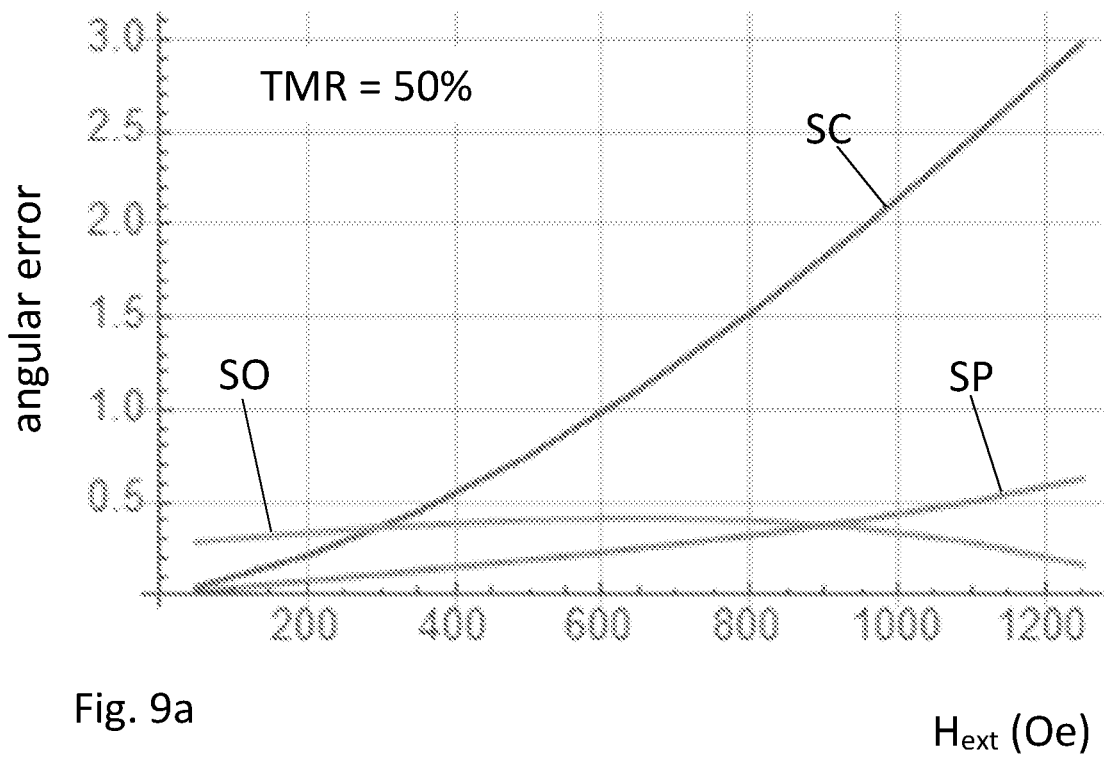
Fig. 9a  $H_{ext}$ (Oe)
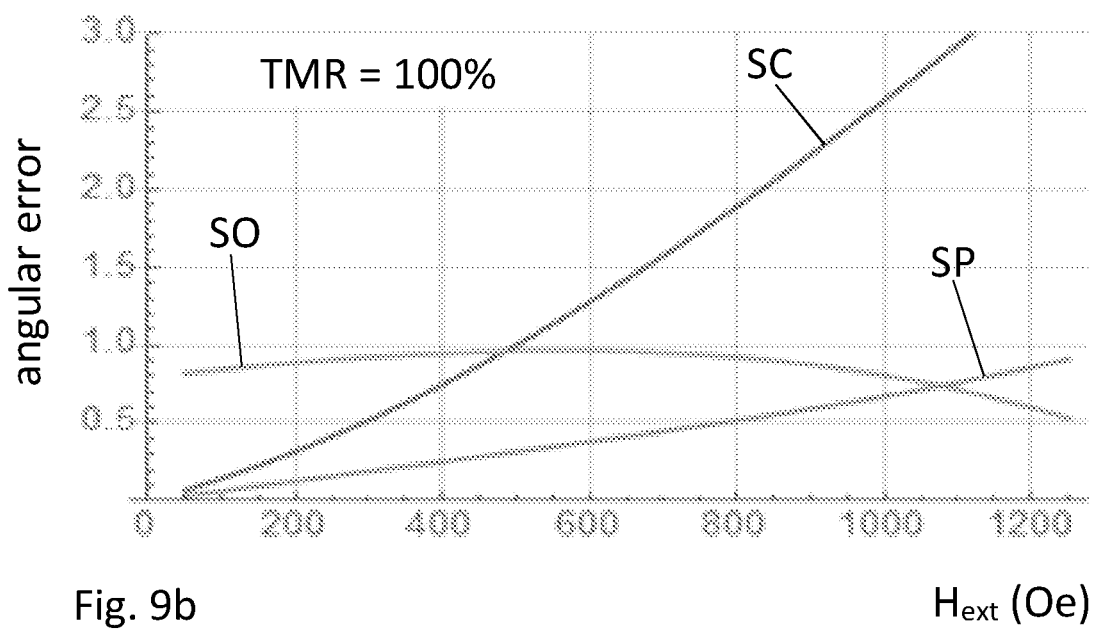
Fig. 9b  $H_{ext}$ (Oe)

MAGNETORESISTIVE-BASED SENSING CIRCUIT FOR TWO-DIMENSIONAL SENSING OF HIGH MAGNETIC FIELDS

FIELD

The present disclosure concerns a magnetic sensing circuit using magnetoresistive sensing elements for two-dimensional sensing an external magnetic field. The present disclosure concerns the sensing of external magnetic fields having high magnitude, with reduced angular error.

DESCRIPTION OF RELATED ART

Magnetic tunnel junction (MTJ) based magnetic angular sensors provide a high sensitivity, wide-range of their output resistance, better integration into CMOS process and many other attractable features compared to the competing technologies existing on the market.

Such magnetic angular sensors require a specific MTJ multilayer film typically comprising two magnetically different ferromagnetic layers separated by a dielectric tunneling barrier. One of the ferromagnetic layers (sensing layer) is magnetically soft and is easily aligned by an external magnetic field, the other one is magnetically rigid (reference layer) with a pinned direction of its magnetization.

Tunnel magnetoresistance (TMR) effect is employed to sense the relative angle between the magnetization of the sensing layer and the magnetization of the reference layer, and thus to measure a direction of an external magnetic field. Change of the relative angle between the sensing layer and the reference layer magnetization can be determined by measuring a change of the electrical conductivity through the MTJ stack. The conductivity of an MTJ multilayer follows a cosine function of the relative angle between net magnetization direction in the sensing and reference layers.

FIG. 1 shows two magnetic sensor elements 20 arranged in a half-bridge circuit configuration. The half-bridge circuit 10 produces an output voltage $V_{out}$ that is a fraction of its input voltage $V_{in}$. One of the two magnetic sensor elements 20 has a reference magnetization 230 that is pinned in opposed direction to the reference magnetization 230 of the other magnetic sensor element 20. The sense magnetization 210 in both sensor elements 20 follows a magnetic field direction 60. A sensing axis 250 of the half-bridge coincides with the pinning direction of one of magnetic sensors 20, i.e. the direction of the reference magnetization 230. In the example of FIG. 1, the sensing axis 250 of the half-bridge coincides with the pinning direction of the top magnetic sensors 20. A magnetic field applied collinearly to the sensing axis 250 provides maximal $V_{in}/V_{out}$ value for positive magnetic field amplitude and minimal $V_{in}/V_{out}$ value for negative magnetic field amplitude. For other magnetic field directions $V_{in}/V_{out}$ value is proportional to projection of the magnetic field on the sensing axis 250. Half-bridge 10, is a basic functional element of 2D magnetic field sensor. A full 2D magnetic field sensor can be obtained from two half bridge circuits 10 where the sensing axes are substantially orthogonal to each other. Arctangent of their instant output voltages ratio $V_{out1}/V_{out2}$ under the same magnitude of input voltage $V_{in1}=V_{in2}$ will give the magnetic field angle. Similarly, each of these two half-bridges 10 can be replaced by a full bridge (comprising four sensor elements 20), so that a sensing axis (corresponding to a direction of the reference magnetization 230 of one of the sensors elements 20) of a half bridge or a full bridge would be parallel to the direction of the pinned direction 231 for the corresponding sensor element 20.

FIG. 2 shows an example of cross section view of an MTJ multilayer for a magnetic sensor element 20. In its simplest configuration, the multilayer comprises a tunnel barrier spacer layer 22 sandwiched between a ferromagnetic reference layer 23 and a ferromagnetic sense layer 21. The ferromagnetic reference layer 23 has a reference magnetization 230 that is pinned in a pinning direction 231. The ferromagnetic sense layer 21 has a sense magnetization 210 that can be freely oriented relative to the reference magnetization 230. When the sensor element 20 is in the presence of an external magnetic field 60, the reference magnetization 230 remains substantially fixed in its pinned direction 231 while the sense magnetization 210 is deflected in the direction of the external magnetic field 60. Pinning the reference magnetization 230 can be achieved by a pinning layer 24 (such as an antiferromagnetic layer) exchange coupling the reference magnetization 230 (pinning field).

The direction of the external magnetic field 60 can thus be measured by applying DC voltage $V_{in}$ (see FIG. 1) to the half-bridge circuit 10 and measuring voltage divider ratio ($V_{in}/V_{out}$). Under idealized conditions, the divider ratio $V_{in}/V_{out}$ follows cosine function of external magnetic field angle.

For two-dimensional (2D) magnetic field sensing applications, the reference magnetization 230 usually lies in-plane (in the plane of the reference layer 23). A 2D magnetic field sensor can be obtained by providing two half-bridges 10 having the reference magnetization 230 being rotated at 90° with respect to each other. Therefore, a 2D magnetic field sensor is a combination of two half-bridges 10 with orthogonally directed reference magnetizations 230. To increase the magnetic field sensor sensitivity and provide differential output, each of the half-bridges 10 can be replaced by a full bridge (see FIG. 3). Usually, a full bridge comprises two half-bridges 10, one half-bridge having its sensing axe 250 oriented at 180° with respect to the sensing axes 250 of the other half-bridge. An angle of the external magnetic field 60 can be measured by taking arctangent function of divider ratio $V_{in}/V_{out}$ from the orthogonal half-bridges (or full bridges).

Under idealized conditions, the reference magnetization 230 of each "ideal" sensor element 20 in a 2D magnetic field sensor should have an infinite stiffness such that its direction is not affected by the external magnetic field 60, at least within a useful range of the external magnetic field 60. The sense magnetization 210 of the "ideal" sensor element 20 should also be perfectly soft such that its direction is magnetized perfectly in the direction of the external magnetic field 60.

Practically however, in a "non-ideal" sensor elements 20, the sense layer 21 has a finite magnetic anisotropy. The sense magnetization 210 can be subjected to finite stray field from the reference layer 23. This causes angular errors in the alignment of the sense magnetization 210 in the external magnetic field 60 and thus angular errors in the magnetic field sensing. These angular errors limit operational margin of the sensor at low magnitudes of the external magnetic field, since the angular error increases when lowering the magnitude of the external magnetic field 60.

Moreover, in a "non-ideal" sensor elements 20, the reference magnetization 230 has finite magnetic stiffness and therefore can be deflected (even only slightly) by the external magnetic field 60. This also produces angular errors in the alignment of the sense magnetization 210. These angular errors increase with the magnitude of the external magnetic field 60 and therefore limit the high-field operation margin of the magnetic sensor element 20 and 2D magnetic field sensor based on the magnetic sensor element 20. For high magnitudes of the external magnetic field 60 (at least greater than 50 Oe), finite magnetic stiffness of reference magnetization 230 causes a characteristic "triangular" distortion of the output signal $V_{out}$ coming from half-bridge 10 or full bridge (see FIG. 4). The distortion results in an angular error in the orientation of the sense magnetization 210 relative to the orientation of the external magnetic field 60.

FIG. 4 is a waveform diagram illustrating the output voltage $V_{out}/V_{in}$ of the half-bridge (or full-bridge) sensing circuit 10 as a function of the orientation of the external magnetic field 60 ($H_{ext}$ angle) with respect the sensing axis direction 250. In particular, FIG. 4 compares the output voltage $V_{out}$ of the half-bridge (or full-bridge) sensing circuit 10 comprising "ideal" sensor elements 20, corresponding to a "pure" sinusoidal curve (plain line 11) to the output voltage $V_{out}$ of the half-bridge (or full-bridge) sensing circuit 10 comprising "non-ideal" sensor elements 20, having the characteristic "triangular" distortion of the output signal $V_{out}$ (dotted line 12).

FIG. 5 shows the angular deviation caused by "non-ideal" sensor elements 20. As one can see, there are higher harmonics in the distortion.

FIG. 6 represents variant of the magnetic angular sensing bridge circuit of FIG. 1 comprising a half-bridge 10, wherein each sensor element TMR1 and TMR2 of the half-bridge 10 is connected in series another sensor element TMR3 and TMR4. In particular, the sensor element TMR1 is series-connected with the sensor element TMR3 and the sensor element TMR2 is series-connected with the sensor element TMR4. The resultant voltage $V_{out}$ is a voltage drop over the series-connected sensor elements TMR4 and TMR2 under $V_{in}$ voltage applied to all four sensor elements TMR1, TMR2, TMR3 and TMR4.

To cancel the higher order harmonics in the output signal $V_{out}$, the reference magnetization 230 of the sensor elements TMR3 and TMR4 can be shifted by 60° relative to the orientation of the sensor elements TMR1 and TMR2, respectively. In other words, the sensing axe 250 of the sensor elements TMR3 and TMR4 is shifted by 60° relative to the sensing axe 250 of the sensor elements TMR1 and TMR2 in order to cancel the $3^{rd}$ harmonic. Note that the sensing axe 250 of the sensor elements TMR3 and TMR4 can be shifted by 36° relative to the sensing axe 250 of the sensor elements TMR1 and TMR2 in order to cancel the $5^{rd}$ harmonic, etc.; following the rule of 180°/n, where n- is the harmonic number to be canceled.

However, magnetic field sensors comprising TMR-based sensor elements 20 arranged in half-bridges connected in series have high angular error for high TMR values. This is due to the conductance-based angular dependence of the TMR effect. In other words, the series arrangement of half-bridges comprising TMR-based sensor elements 20 having 180°/n phase shifted sensor elements 20 (as exemplified in FIG. 6) is not optimal because in TMR effect the conductivity follows cosine of external magnetic angle but not the resistivity (as in GMR effect, for example).

SUMMARY

According to the invention, a magnetic sensing circuit for sensing an orientation of an external magnetic field in a plane, comprises a circuit portion including: a main half-bridge comprising series-connected main tunnel magnetoresistive sensor elements TMR1 and TMR2; a first auxiliary half-bridge connected in parallel to the main half-bridge, said first auxiliary half-bridge comprising series-connected auxiliary tunnel magnetoresistive sensor elements TMR3 and TMR4 with an output voltage emerging from the connection between TMR1 and TMR3 and between TMR2 and TMR4; wherein each sensor element TMR1, TMR2, TMR3 and TMR4 comprises a tunnel barrier spacer layer sandwiched between a ferromagnetic reference layer having a reference magnetization that is pinned in a pinning direction and a ferromagnetic sense layer having a sense magnetization that can be freely oriented; wherein the reference magnetization of the magnetoresistive sensor element TMR1 and TMR3 are respectively oriented substantially antiparallel with respect to the reference magnetization of the magnetoresistive sensor element TMR2 and TMR4; and wherein said first auxiliary half-bridge has a sensing axis that differs from the sensing axis of the main half bridge by an angle of about 180°/n, where n is the harmonic number to be canceled.

Compared to the prior art, the magnetic sensing circuit disclosed herein provides noticeably better cancellation of $n^{th}$ harmonics in the output signal and allows for sensing of external magnetic fields having high magnitude, with reduced angular error.

BRIEF DESCRIPTION OF THE DRAWINGS

The invention will be better understood with the aid of the description of an embodiment given by way of example and illustrated by the figures, in which:

FIGS. 9a, 9b, and 9c compare simulated angular error as a function of the amplitude of the external magnetic field for the sensing bridge circuit of FIG. 7 and of FIG. 6;

DETAILED DESCRIPTION OF POSSIBLE EMBODIMENTS

Figure 7:
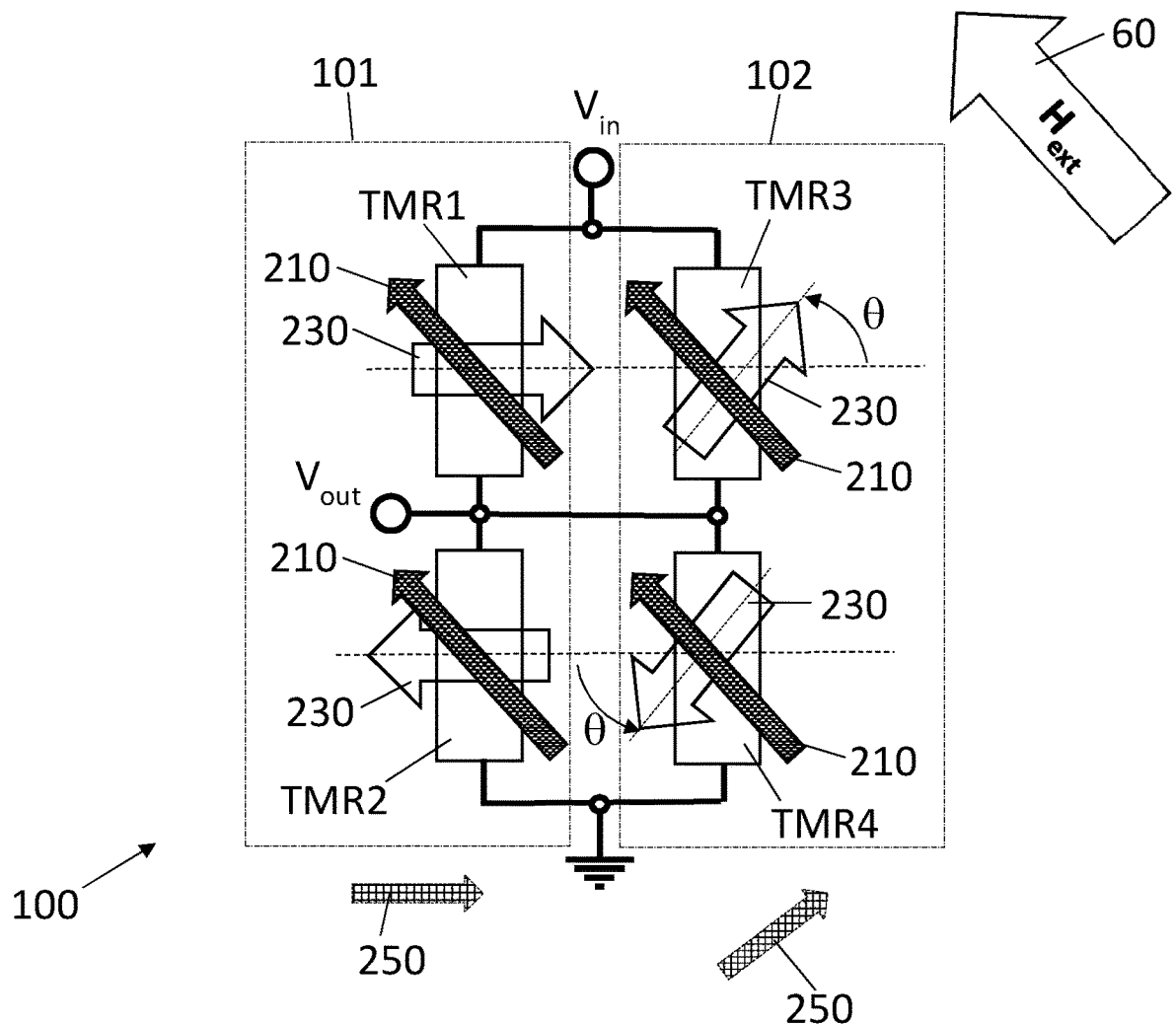
FIG. 7 shows a magnetic angular sensing bridge circuit, according to an embodiment.

FIG. 7 shows a magnetic sensing half bridge circuit 100 for sensing an orientation of an external magnetic field 60 in a plane, according to an embodiment. The magnetic sensing circuit comprises a circuit portion 100 including a main half-bridge circuit 101 comprising two series-connected main tunnel magnetoresistive sensor elements TMR1 and TMR2. The circuit portion 100 further comprises a first auxiliary half-bridge 102 comprising two series-connected auxiliary tunnel magnetoresistive sensor elements TMR3 and TMR4. The first auxiliary half-bridge 102 is connected in parallel to the main half-bridge circuit 101.

Figure 2:
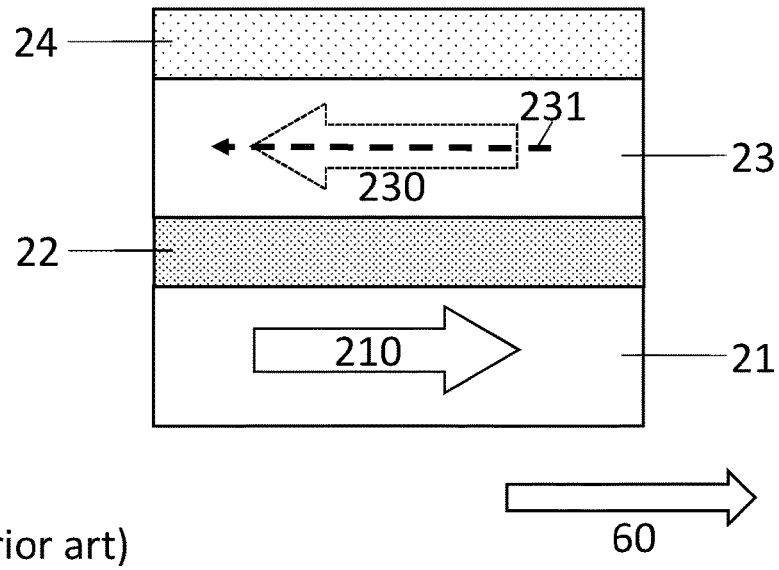
FIG. 2 shows an exemplary cross section view of a TMR multilayer for sensor element.
Figure 3:
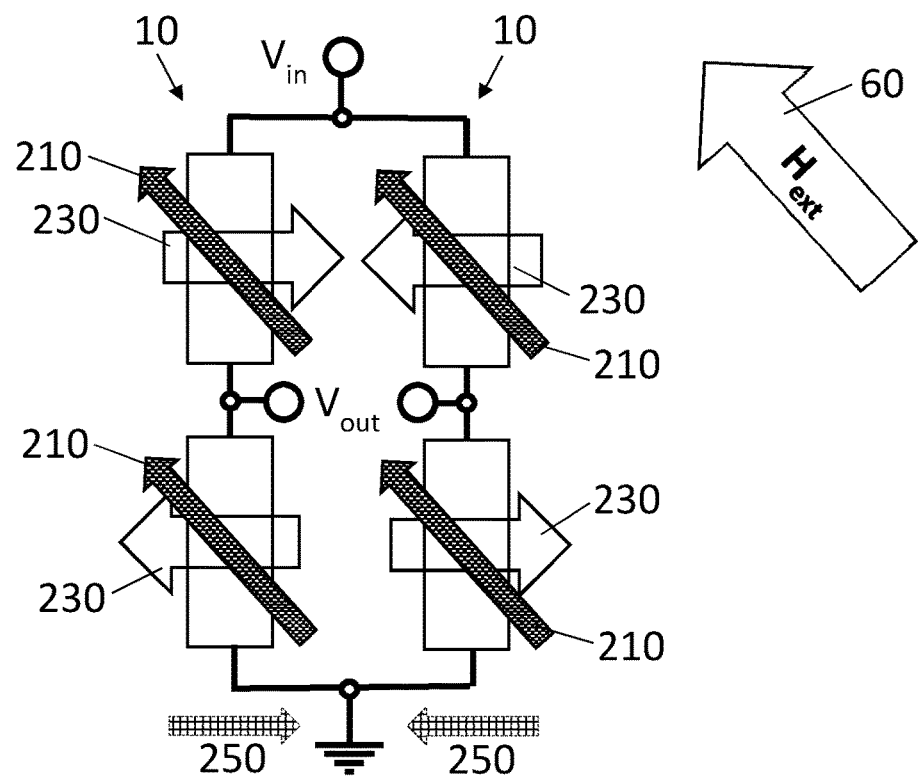
FIG. 3 shows a full bridge assembled from two half bridges with 180° rotated sensing axes.
Figure 4:
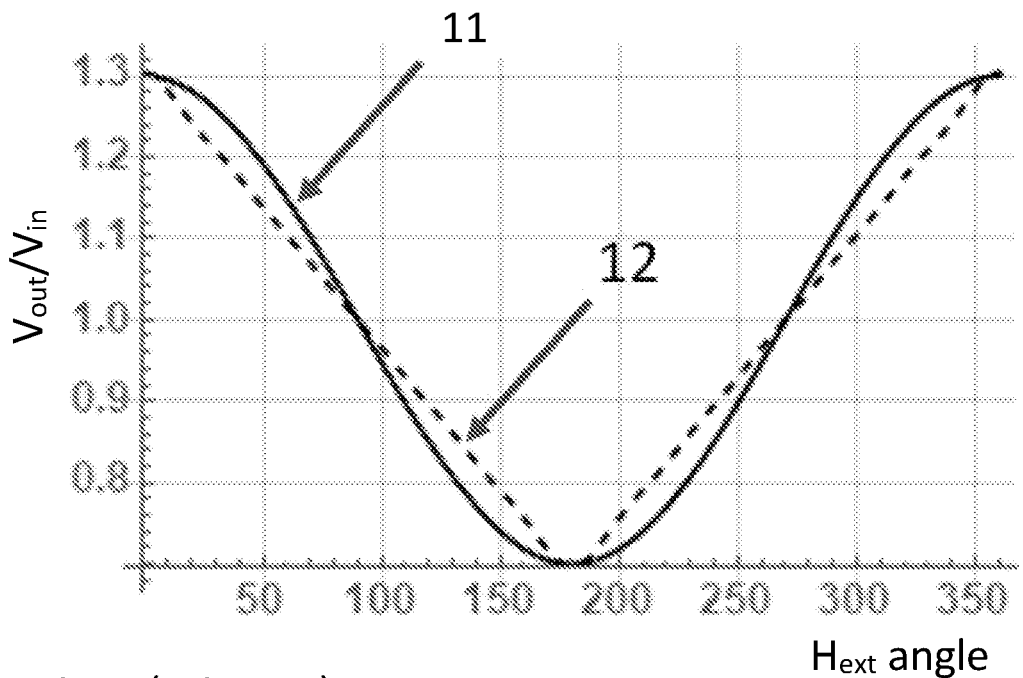
FIG. 4 is a waveform diagram illustrating the output voltage of the half-bridge sensing circuit of FIG. 1 as a function of the orientation of an external magnetic field.
Figure 5:
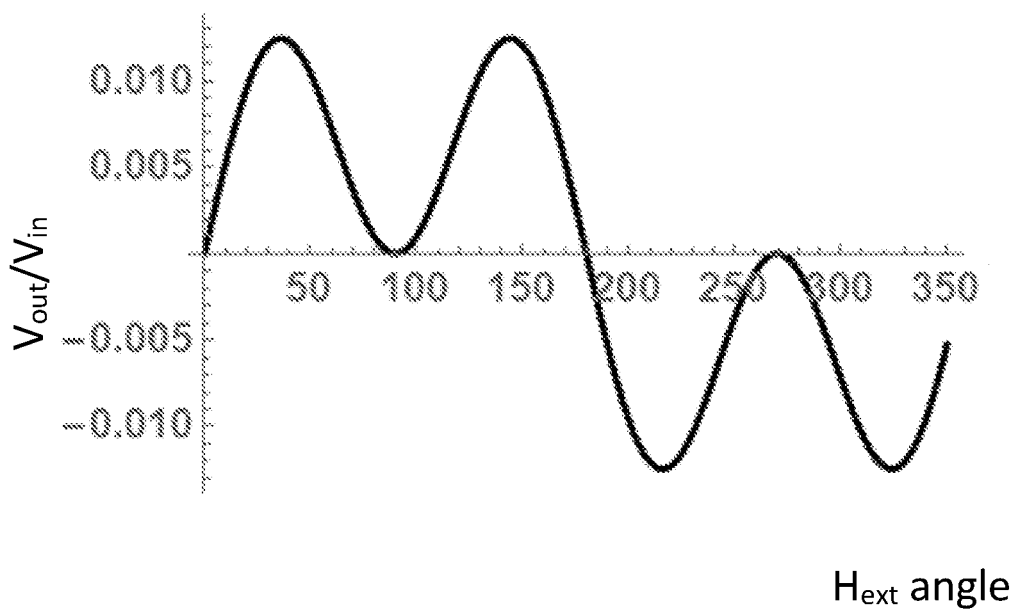
FIG. 5 shows the angular deviation of a real half bridge from perfect cosinusoidal output as a function of external magnetic field angle.

Each tunnel magnetoresistive sensor element TMR1, TMR2, TMR3 and TMR4 comprises a tunnel barrier spacer layer 22 sandwiched between a ferromagnetic reference layer 23 and a ferromagnetic sense layer 21, as shown in FIG. 2. The ferromagnetic reference layer 23 has a reference magnetization 230 that is pinned in a pinning direction 231. The ferromagnetic sense layer 21 has a sense magnetization 210 that can be freely oriented relative to the reference magnetization 230. In the presence of an external magnetic field 60, the reference magnetization 230 remains substantially fixed in its pinned direction 231 while the sense magnetization 210 is deflected in the direction of the external magnetic field 60. The reference magnetization 230 of the magnetoresistive sensor element TMR1 and TMR3 are respectively oriented substantially antiparallel with respect to the reference magnetization 230 of the magnetoresistive sensor element TMR2 and TMR4.

Figure 8:
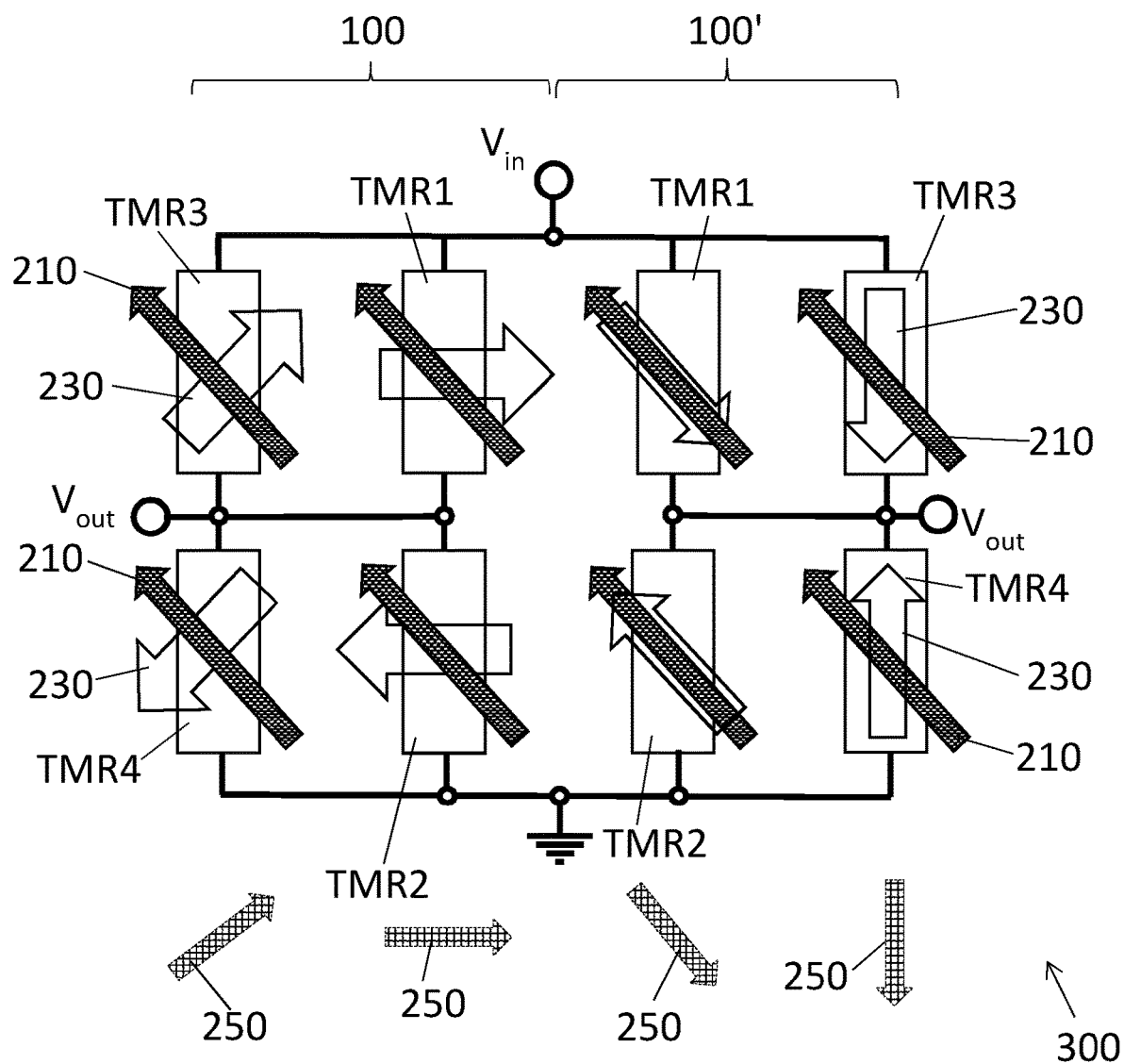
FIG. 8 shows a full 2D sensor device circuit comprising two half-bridge circuits with 90° rotated sensing axes between them.

An input voltage $V_{in}$ applied across the main half-bridge circuit 101 and the first auxiliary half-bridge 102. An output voltage $V_{out}$ emerges from the connection between TMR1 and TMR3 and between TMR2 and TMR4. The circuit portion 100 functions as a voltage divider wherein the output voltage $V_{out}$ is a fraction of the input voltage $V_{in}$. FIG. 8 shows an example of a full-bridge 2D sensor device circuit 300 comprising two half bridge circuits 100 and 100'. The sensing axis 250 of one of the half bridge circuits 100 is oriented substantially orthogonal to the sensing axis 250 of the other full bridge circuit 100'. The orientation of the external magnetic field 60 can be measured by applying an equal voltage $V_{in}$ to each circuit portion 100, 100' and by calculating the arctangent function of the ratio of their outputs $V_{out}$.

In an embodiment, the first auxiliary half-bridge 102 is configured such that the sensing axis 250 differs from the sensing axis 250 of the main half bridge 101 by an angle θ of about 180°/n, where n- is the harmonic number to be canceled.

In an embodiment, the first auxiliary half-bridge 102 is configured such that the sensing axis 250 of the second half-bridge 102 differs from the sensing axis 250 of the main half-bridge 101 by an angle θ of about 60° for $3^{rd}$ harmonics cancelling.

In another embodiment, the first auxiliary half-bridge 102 is configured such that its sensing axis 250 differs from the sensing axis 250 of the main half-bridge 101 by an angle θ of about 36° for $5^{th}$ harmonics cancelling.

Figure 6:
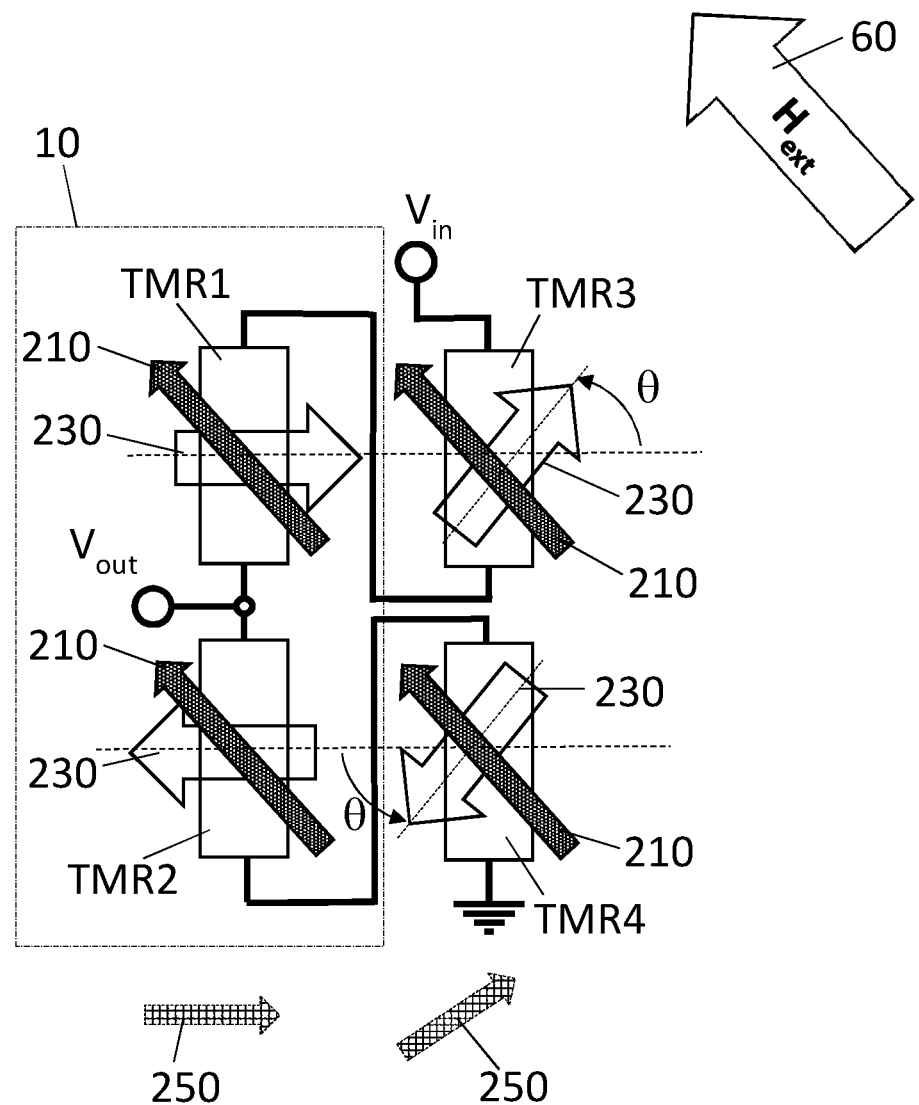
FIG. 6 shows a prior art with in-series connection of auxiliary sensing branches.
Figure 9C:
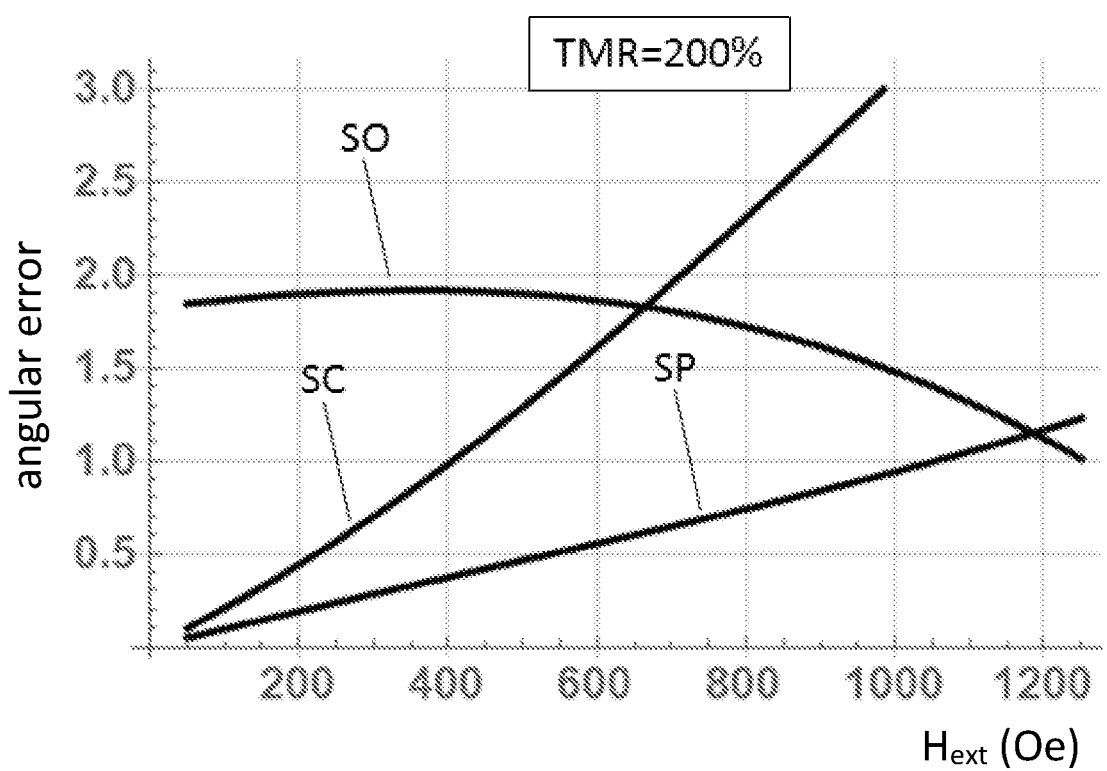

FIGS. 9a to 9c compare simulated $V_{out}$ angular error as a function of the amplitude of the external magnetic field $H_{ext}$ for the proposed "parallel" circuit portion 100 of FIG. 7 (curve SP) and the "in-series" magnetic angular sensing bridge circuit of FIG. 6 (curve SO). Simulations were performed for a pinning field of 3.6 kOe and a TMR of 50% (FIG. 9a), 100% (FIG. 9b) and 200% (FIG. 9c). FIGS. 9a to 9c further compare simulated curves SP and SO to the simulated $V_{out}$ angular error as a function of the amplitude of the external magnetic field $H_{ext}$ for the "conventional" magnetic angular sensing bridge circuit 10 of FIG. 1 (curve SC). Electrical response to the rotating magnetic field 60 for the proposed "parallel" circuit portion 100 of FIG. 7 and "in-series" magnetic sensing circuit of FIG. 6 was made under assumption of the third harmonic cancelling only. Thus the sensing axis 250 of the first auxiliary half bridges are 60° rotated with respect to the sensing axe 250 of the main half bridges.

Figure 1:
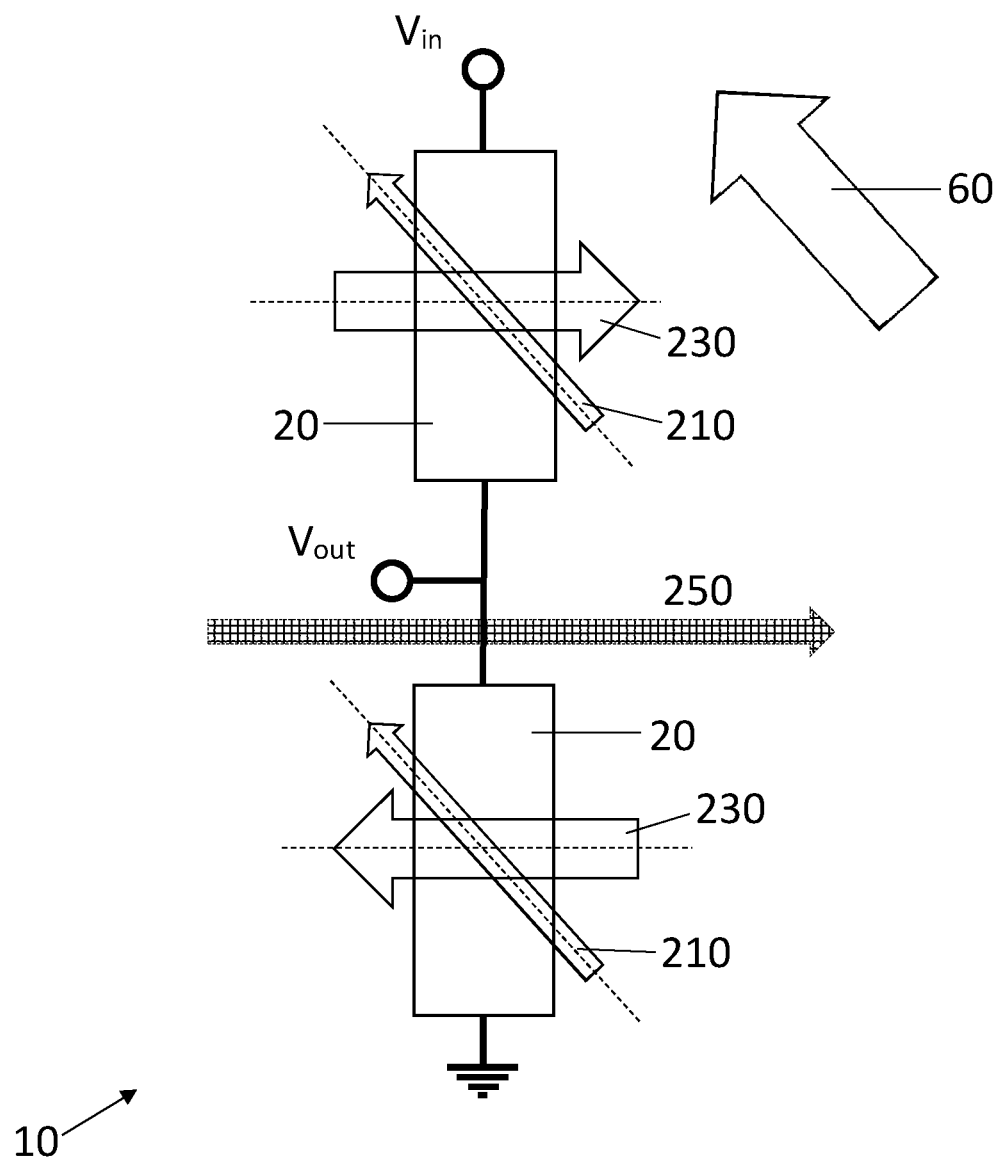
FIG. 1 shows two magnetic sensor elements arranged in a half-bridge circuit configuration, wherein the half bridge sensing axis coincides with the pinning direction of the top sensor element.

FIGS. 9a to 9c show that, in comparison with the standard half-bridge circuit 10 of FIG. 1, magnetic angular sensing half bridge circuits of FIGS. 6 and 7 are characterized by a significative lower angular error for high external magnetic fields $H_{ext}$ due to cancellation of a higher order harmonic.

The "parallel" circuit portion 100 of FIG. 7 has lower angular error than the output $V_{out}$ of the "conventional" circuit 10 of FIG. 1 over the whole range of external magnetic fields $H_{ext}$ (between 0 and 900 Oe). The output $V_{out}$ of the "series" magnetic sensing circuit of FIG. 6 has lower angular error than the output $V_{out}$ of the "conventional" circuit 10 of FIG. 1 over the whole range of external magnetic fields $H_{ext}$ (between 0 and 1200 Oe). Therefore both magnetic sensing circuits of FIGS. 6 and 7 show improvement in angular error.

Increasing the TMR magnitude results in an increase of the angular error in the output $V_{out}$ for the "conventional" circuit 10 of FIG. 1, the "parallel" circuit portion 100 of FIG. 7 and the "series" magnetic sensing circuit of FIG. 6. However, as can be seen in FIGS. 9a to 9c, the increase of angular error for the "parallel" circuit portion 100 of FIG. 7 is much less that for the "series" circuit of FIG. 6.

The cancellation of third harmonic in the output signal $V_{out}$, as shown by these simulations, is thus more efficient when the first auxiliary half bridge 102 is connected in-parallel to the main half-bridge 101, for a wider range of external magnetic fields $H_{ext}$ and TMR. The same remains valid for higher order harmonics cancellation.

Figure 10:
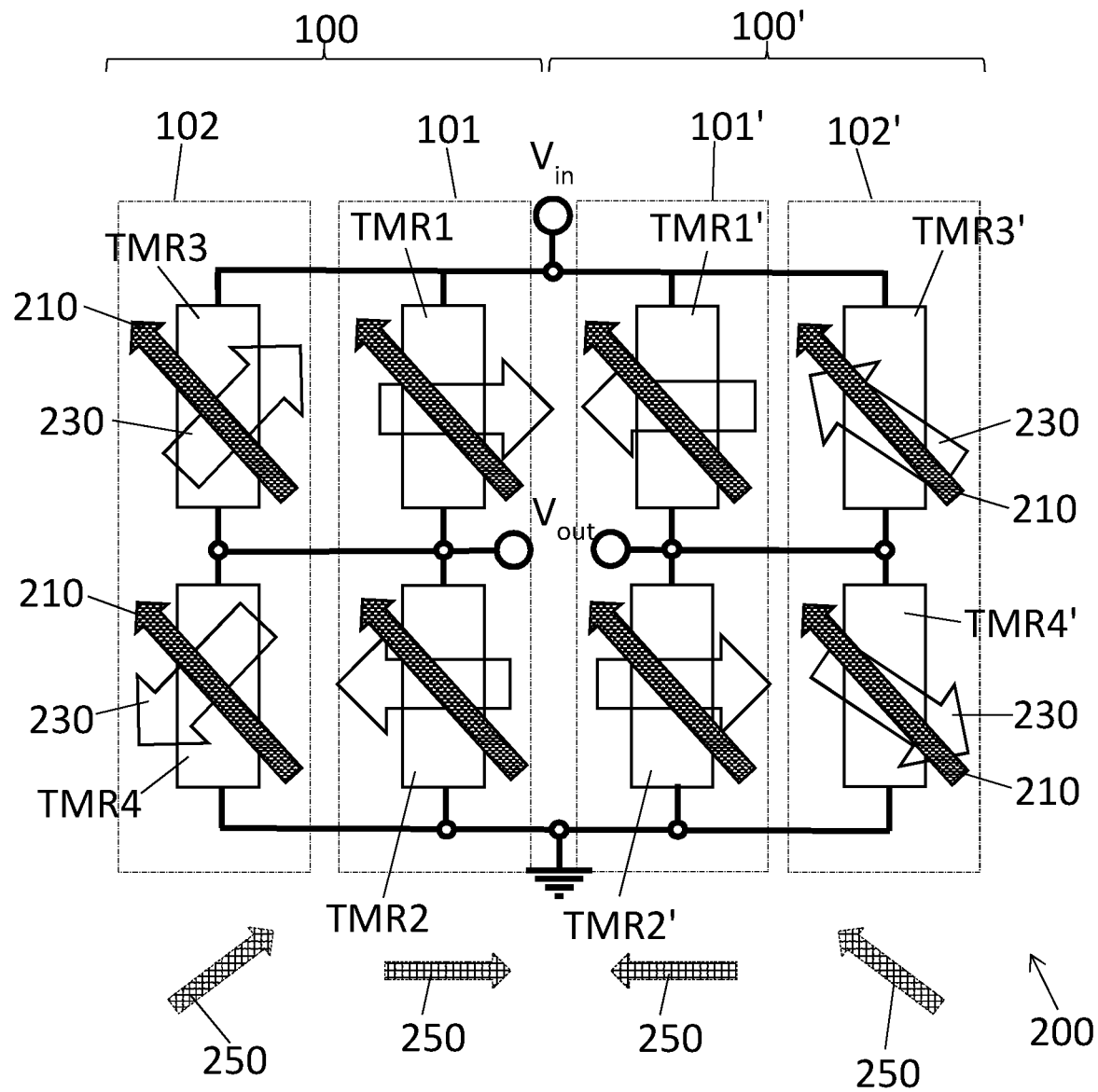
FIG. 10 shows a magnetic sensing full bridge circuit, according to an embodiment.

FIG. 10 shows a magnetic sensing full bridge circuit 200, according to another embodiment. The sensing bridge circuit 200 comprises two circuit portion 100, 100', such as the one of FIG. 7, connected in parallel. One of the circuit portion 100 is represented with the tunnel magnetoresistive sensor element TMR1, TMR2, TMR3 and TMR4 and the other circuit portion 100' is represented with the tunnel magnetoresistive sensor element TMR1', TMR2', TMR3' and TMR4'.

The reference magnetization 230 of the magnetoresistive sensor element TMR1 and TMR3 are respectively oriented substantially antiparallel with respect to the reference magnetization 230 of the magnetoresistive sensor element TMR2 and TMR4. Similarly, the reference magnetization 230 of the magnetoresistive sensor element TMR1' and TMR3' are respectively oriented substantially antiparallel with respect to the reference magnetization 230 of the magnetoresistive sensor element TMR2' and TMR4'.

The input voltage $V_{in}$ is applied across the two in-parallel circuit portions 100, 100'. An output voltage $V_{out}$ emerges from the connection between TMR1 and TMR3 and between TMR2 and TMR4, and from the connection between TMR1' and TMR3' and between TMR2' and TMR4'. Thus, the magnetic sensing circuit 200 functions as a voltage divider wherein the output differential voltage $V_{out}$ is a fraction of the input voltage $V_{in}$ for a given magnetic field angle.

Similarly to the circuit shown in FIG. 8, two sensing circuits 200 with 90° rotated pinning direction of all TMR elements compose a full 2D angular sensor. The orientation of the external magnetic field 60 can be measured by applying an equal voltage $V_{in}$ to each magnetic sensing circuit 200, and by calculating the arctangent function of ratio of their differential output voltages $V_{out}$.

In an embodiment, the first auxiliary half-bridge 102, 102' of the circuit portions 100, 100' is configured to have its sensing axis 250 that differs from the sensing axis 250 of the main half bridge 101, 101' by an angle θ of about 180°/n, where n is the harmonic number to be canceled.

In an embodiment, the first auxiliary half-bridge 102, 102' of the circuit portions 100, 100' is configured to have its sensing axis 250 that differs from the sensing axis 250 of the main half bridge 101, 101' by an angle θ of about 60° for $3^{rd}$ harmonics cancelling.

In another embodiment, the first auxiliary half-bridge 102, 102' of the circuit portions 100, 100' is configured to have its sensing axis 250 that differs from the sensing axis 250 of the main half bridge 101, 101' by an angle θ of about 36° for $5^{th}$ harmonics cancelling.

The main half-bridges 101, 101' in one of the circuit portion 100 are configured such that their sensing axis 250 are oriented at substantially 180° with respect to each other.

Figure 11:
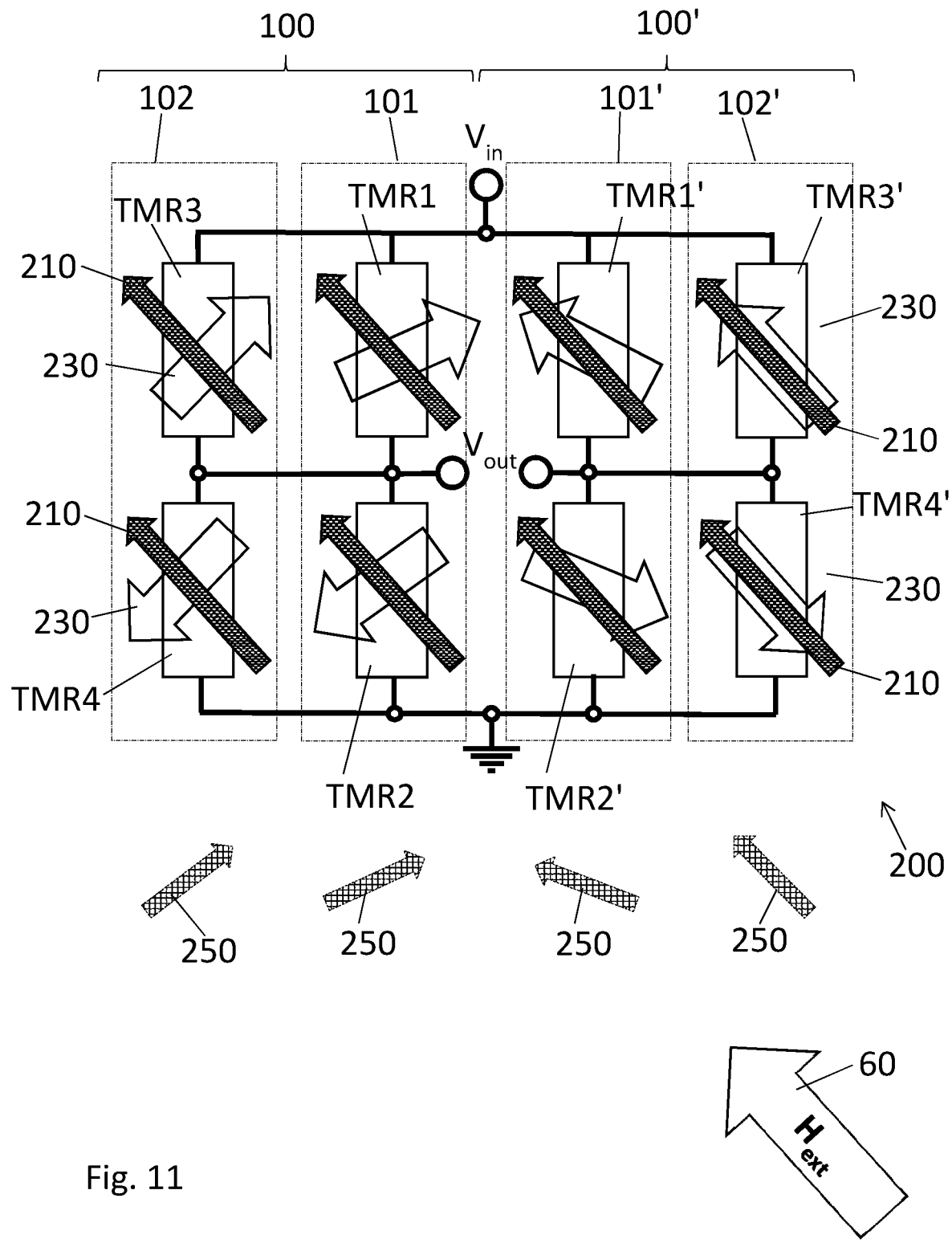
FIG. 11 shows a magnetic sensing full bridge circuit, according to another embodiment.

FIG. 11 shows a variant of the magnetic sensing circuit 200 of FIG. 10 wherein one of the main half-bridge 101 is configured such that its sensing axis 250 is oriented with an angle θ of about 180°-180°/$n_1$ with respect to the sensing axis 250 of the other main half-bridge 101'.

First auxiliary half-bridge 102 is configured such that its sensing axis 250 direction differs from the sensing axis 250 direction of the first main half-bridge 101 by an angle θ of about 180°/$n_2$. First auxiliary half-bridge 102' is configured such that its sensing axis 250 direction differs from the sensing axis 250 direction of the first main half-bridge 101' by an angle θ of about 180°/$n_2$.

The configuration of the magnetic sensing circuit 200 of FIG. 11 allows for simultaneous cancelling of the $n_1$-th and $n_2$-th harmonics.

It is understood that the present invention is not limited to the exemplary embodiments described above and other examples of implementations are also possible within the scope of the patent claims.

For example, each of main tunnel magnetoresistive sensor elements TMR1 and TMR2 can comprise a plurality of tunnel magnetoresistive sensor elements connected in series. Each of the auxiliary tunnel magnetoresistive sensor elements TMR3 and TMR4 can comprise a plurality of tunnel magnetoresistive sensor elements connected in series.

Figure 12:
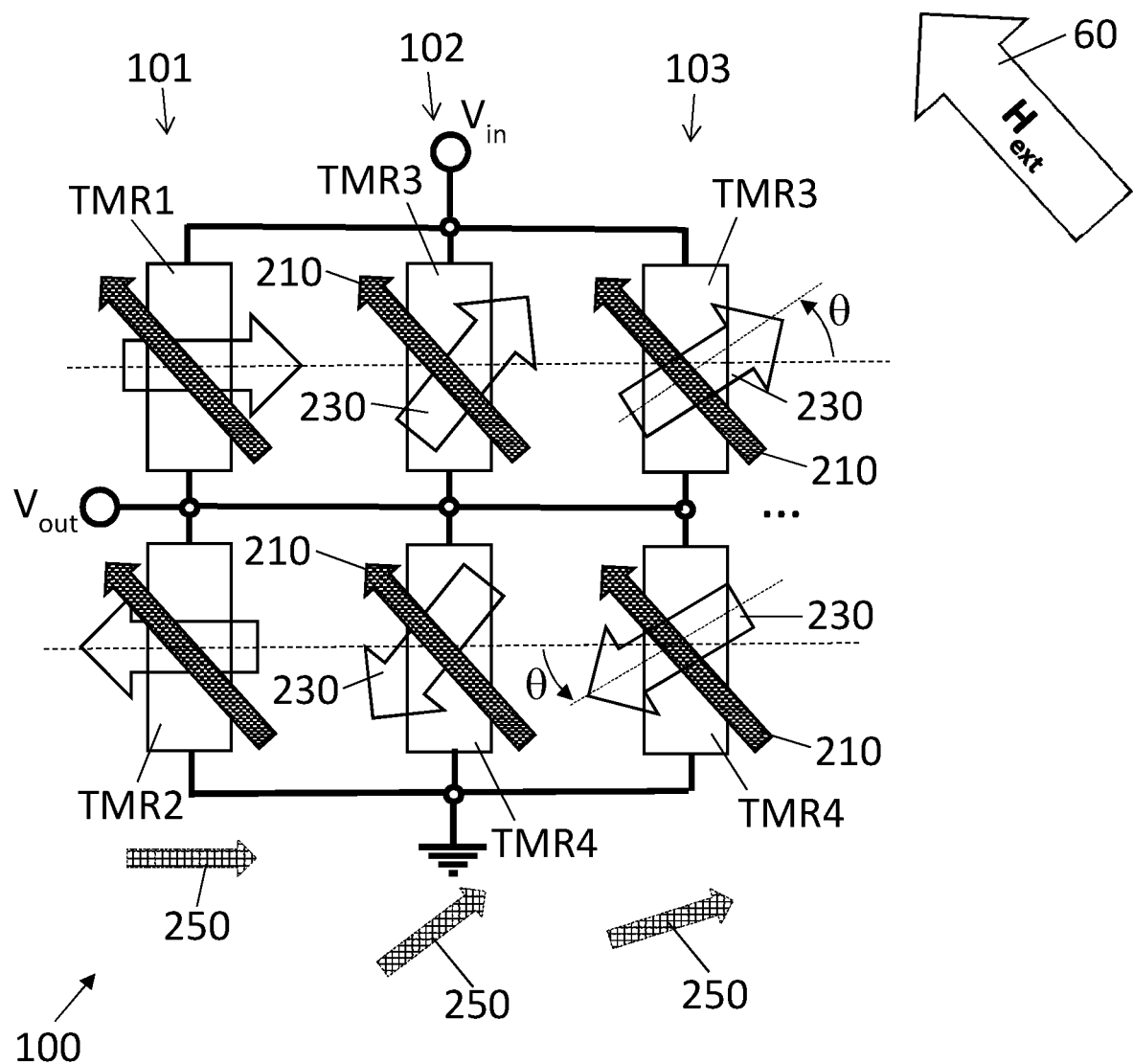
FIG. 12 shows a magnetic sensing half bridge circuit, according to yet another embodiment.

FIG. 12 shows a magnetic sensing half bridge circuit comprising a circuit portion 100 according to an embodiment. The circuit portion 100 comprises a main half-bridge 101 a first auxiliary half-bridge 102 and a second auxiliary half-bridge 103, both auxiliary half-bridge 102, 103 being connected in parallel to the main half-bridge 101. The first auxiliary half-bridge 102 has its sensing axis 250 direction that differs from the sensing axis 250 direction of the main half-bridge 101 by an angle θ of about 180°/$n_1$. The second auxiliary half-bridge 103 has its sensing axis 250 direction that differs from the mean direction of sensing axes 250 of the main half-bridge 101 and first auxiliary half-bridge 102 by an angle θ of about 180°/$n_2$. This configuration of the circuit portion 100 allows for simultaneous cancelling of the $n_1$-th and $n_2$-th harmonics.

The half bridge circuit 100 can comprise a plurality of auxiliary half-bridges 102, 103, etc., connected in parallel to the main half-bridge 101. Each additionally connected auxiliary half-bridge is configured such that its sensing axis 250 direction differs from the mean direction of all sensing axes 250 of the main half-bridge and all other auxiliary half-bridges by an angle θ of about 180°/n where n can be different for each additional auxiliary half-bridge. This configuration allows for cancelling a plurality of harmonics. Half-bridge electrical resistance of each additionally connected auxiliary half-bridge has to be adjusted for optimal cancelation of n-th harmonic.

For example, the circuit portion 100 can comprise a third auxiliary half-bridge (not shown) having its sensing axis 250 direction that differs from the mean direction of sensing axes 250 of the main half-bridge 101 and auxiliary half bridge 102 by an angle θ of about 180°/$n_3$. Such configuration allows for simultaneous cancelling of the $n_1$-th, $n_2$-th and $n_3$-th harmonics, for example, a 60°-angle filters the $3^{rd}$ harmonic, a 45°-angle filters the $4^{th}$ harmonic, a 36°-angle filters the $5^{th}$ harmonic, a 30°-angle filters the $6^{th}$ harmonic, etc. The value of n is preferably greater than 2.

A plurality of the half bridge circuit 100 of FIG. 12 can be connected in parallel to obtain an improved magnetic sensing full bridge circuit 200, such as the ones shown in FIGS. 10 and 11.

REFERENCE NUMBERS AND SYMBOLS 10 magnetic sensing half bridge bridge circuit
11 cosinusoidal output curve
12 distorted output curve
100, 100' magnetic sensing half bridge circuit
101, 101' main half-bridge
102, 102' first auxiliary half-bridge
103 second auxiliary half-bridge
21 ferromagnetic sensing layer
210 sense magnetization
20 MTJ multilayer film
22 tunnel barrier layer
23 ferromagnetic reference layer
200 magnetic sensing circuit
230 reference magnetization
231 pinning direction
250 sensing axis
24 pinning layer
300 full 2D sensor device circuit
60, $H_{ext}$ external magnetic field
TMR1, TMR2 main sensor element
TMR1', TMR2' main sensor element
TMR3, TMR4 auxiliary sensor element
TMR3', TMR4' auxiliary sensor element
SC simulation for circuit of FIG. 1
SP simulation for circuit of FIG. 7
SO simulation for circuit of FIG. 6
θ angle

The invention claimed is:

1. Magnetic sensing half-bridge circuit for sensing an orientation of an external magnetic field in a plane, comprising a circuit portion including:
  a main half-bridge comprising series-connected main tunnel magnetoresistive sensor elements TMR1 and TMR2;
  a first auxiliary half-bridge connected in parallel to the main half-bridge, said first auxiliary half-bridge comprising series-connected auxiliary tunnel magnetoresistive sensor elements TMR3 and TMR4 with an output voltage emerging from the connection between TMR1 and TMR3 and between TMR2 and TMR4;
  wherein each sensor element TMR1, TMR2, TMR3 and TMR4 comprises a tunnel barrier spacer layer sandwiched between a ferromagnetic reference layer having a reference magnetization that is pinned in a pinning direction and a ferromagnetic sense layer having a sense magnetization that can be freely oriented;

wherein the reference magnetization of the magnetoresistive sensor element TMR1 and TMR3 are respectively oriented substantially antiparallel with respect to the reference magnetization of the magnetoresistive sensor element TMR2 and TMR4; and wherein said first auxiliary half-bridge has a sensing axis that differs from the sensing axis of the main half bridge by an angle of 180°/n, where n is the harmonic number to be canceled.

2. The magnetic sensing half-bridge circuit according to claim 1,
wherein said first auxiliary half-bridge is configured such that its sensing axis differs from the sensing axis of the main half-bridge by an angle of 60° for $3^{rd}$ harmonics cancelling.

3. The magnetic sensing half-bridge circuit according to claim 1,
wherein said first auxiliary half-bridge is configured such that its sensing axis differs from the sensing axis of the main half-bridge by an angle of 36° for $5^{th}$ harmonics cancelling.

4. The magnetic sensing half-bridge circuit according to claim 1,
comprising a plurality of auxiliary half-bridges, each auxiliary half-bridge being connected in parallel to the main half-bridge, and wherein each auxiliary half-bridge is configured such that its sensing axis differs from the mean sensing axis of all the others half-bridges by an angle of 180°/n.

5. The magnetic sensing circuit according to claim 4, wherein n is different for each auxiliary half-bridge.

6. The magnetic sensing circuit according to claim 5, wherein n is greater than 2.

7. The magnetic sensing circuit according to claim 1,
comprising a plurality of the circuit portion connected in parallel.

8. The magnetic sensing circuit according to claim 4,
comprising a plurality of the circuit portion connected in parallel,
wherein the main and auxiliary half-bridges in one of the half-bridge circuit portion are configured in a full-bridge, wherein the angle between sensing axes of the main half bridges is 180°.

9. The magnetic sensing circuit according to claim 4,
comprising a plurality of the circuit portion connected in parallel,
wherein the main and auxiliary half-bridges in one of the half-bridge circuit portion are configured in a full-bridge, wherein the angle between sensing axes of the main half bridges is 180°-180°/n.

* * * * *